United States Patent
Phoon et al.

(10) Patent No.: US 7,305,640 B1
(45) Date of Patent: Dec. 4, 2007

(54) PROGRAMMABLE SOFT MACRO MEMORY USING GATE ARRAY BASE CELLS

(75) Inventors: Hee Kong Phoon, Perak (MY); Boon Jin Ang, Penang (MY); Wei Yee Koay, Penang (MY); Bee Yee Ng, Pahang (MY)

(73) Assignee: Altera Corporation, San Jose, CA (US)

( * ) Notice: Subject to any disclaimer, the term of this patent is extended or adjusted under 35 U.S.C. 154(b) by 286 days.

(21) Appl. No.: 10/987,986

(22) Filed: Nov. 12, 2004

(51) Int. Cl.
*G06F 17/50* (2006.01)
(52) U.S. Cl. .............................. 716/10; 716/9
(58) Field of Classification Search ............... 716/1, 716/8–10
See application file for complete search history.

(56) References Cited

U.S. PATENT DOCUMENTS 6,360,356 B1 * 3/2002 Eng ........................ 716/18

2005/0268267 A1 * 12/2005 Shang ........................ 716/9

* cited by examiner

*Primary Examiner*—Vuthe Siek
(74) *Attorney, Agent, or Firm*—Townsend and Townsend and Crew, LLP

(57) ABSTRACT

A system generates memory unit designs tailored to requirements. The system receives a set of specifications for one or more memory units. The set of specifications includes the memory type, the number of memory access ports, and the data width. The system assembles a memory unit schematic from a library of schematic modules defining memory unit components, including memory cells, address decoders, registers, drivers, sense amplifiers, and optionally self-testing components. The system creates a layout for the memory unit from a library of layout modules corresponding to the library of schematic modules. The library of layout modules includes memory unit floorplans specifying the location of layout modules within a memory unit. The system selects from different memory unit floorplans to create an optimized memory unit layout. The memory unit schematic can be validated using functional testing methods. The system processes the memory unit layout to produce a device configuration.

31 Claims, 5 Drawing Sheets

PROGRAMMABLE SOFT MACRO MEMORY USING GATE ARRAY BASE CELLS

BACKGROUND OF THE INVENTION

The present invention relates to the field of programmable devices, and the systems and methods for designing the same. Programmable devices, such as FPGAs, typically includes thousands of programmable logic cells that use combinations of logic gates and/or look-up tables to perform a logic operation. Programmable devices also include a number of functional blocks having specialized logic devices adapted to a specific logic operations. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

To provide additional functionality and improve performance, programmable devices often include one or more gate arrays. Each gate array set can be permanently programmed during manufacturing, for example using mask programming techniques, to implement highly-specialized functional blocks. These specialized functional blocks, referred to as hard IP blocks, enable programmable devices to be tailored to specific application segments. For example, hard IP blocks can implement specialized functional blocks used for networking applications, for wireless communications applications, or for signal processing applications. Although hard IP blocks have a fixed configuration set during manufacturing, the remainder of the programmable device may be later programmed and optionally reprogrammed to implement user designs. Thus, programmable device manufacturers can use hard-IP blocks to mass produce programmable devices tailored for specific application segments while still providing their customers with the ability to implement their own user designs.

Typically, hard IP blocks require some memory to perform their intended functions. To meet this need, a programmable device may include a fixed size memory block interfaced directly with the gate array used to implement the hard IP blocks. However, a fixed sized memory block may not be optimal for each of the different hard IP blocks, in terms of the number of memory blocks, memory size, memory type, and memory access ports. Alternatively, memory can be constructed in the gate array itself by configuring portions of the gate array to act as flip-flops. This solution consumes a large amount of area, which either decreases the number of gates available for the hard-IP block or increases the gate array size and hence cost of the programmable device. Another alternative is to include a diffuse set of memory cells in the gate array. However, because the ratio of memory to logic varies between different hard-IP blocks, this alternative defeats the purpose of using the gate array to efficiently implement a variety of different hard IP blocks.

It is therefore desirable for a system and method to enable users to efficiently create memory units for a variety of different hard-IP blocks. It is further desirable that the system and method enable programmable device users to tailor the characteristics of memory units to match the requirements of each hard-IP block. It is further desirable that the memory units be readily integrated with the design and testing processes of hard-IP blocks.

BRIEF SUMMARY OF THE INVENTION

In an embodiment, a memory unit creation system generates memory unit designs tailored to the requirements of different hard-EP blocks. The system receives a set of specifications for one or more memory units. The set of specifications includes the type of memory, such as SRAM, ROM, or any other memory cell architecture, the number of read and write access ports, and the data width. The system assembles a memory unit schematic from a library of schematic modules defining memory unit components, including memory cells, address decoders, registers, drivers, sense amplifiers, and optionally self-testing components. A layout for the memory unit is created from a library of layout modules corresponding to the library of schematic modules. The library of layout modules also includes memory unit floorplans specifying the location of layout modules within a memory unit. The system can select from different memory unit floorplans to create a memory unit layout optimized for the set of specifications.

The memory unit schematic can be validated using functional testing methods to ensure proper operation. The functional testing can incorporate timing information determined from an analysis of the memory unit layout. Additionally, the memory unit layout, optionally in conjunction with the layout of an associated hard-IP block, can be processed by placement and routing phases to produce a device configuration implementing the memory unit. In a further embodiment, the device configuration is adapted to be programmed into a gate array portion of a programmable device.

BRIEF DESCRIPTION OF THE DRAWINGS

The invention will be described with reference to the drawings, in which.

DETAILED DESCRIPTION OF THE INVENTION

Figure 1:
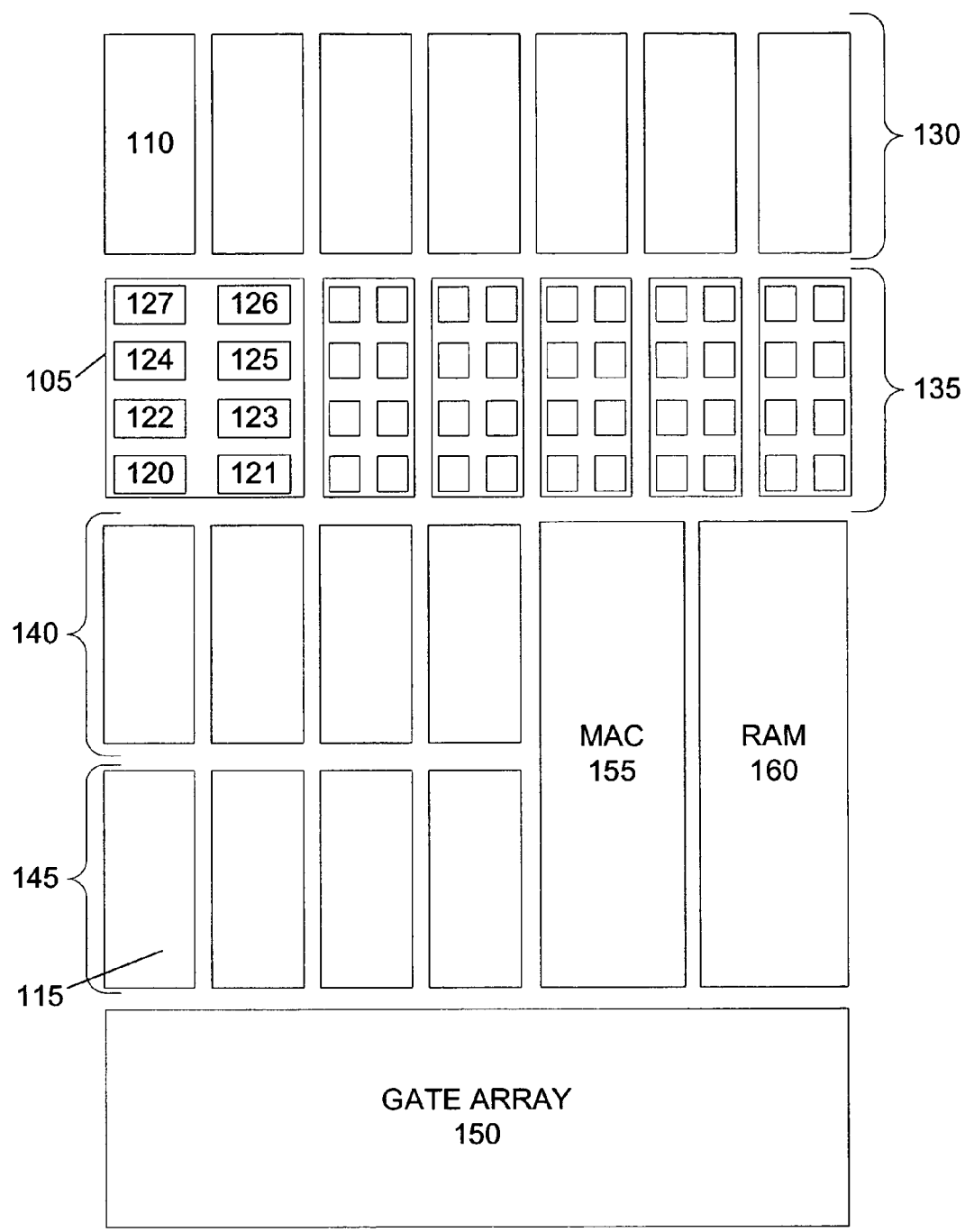
FIG. 1 illustrates a portion of an example programmable device suitable for use with an embodiment of the invention.

FIG. 1 illustrates a portion of an example programmable device 100 suitable for use with an embodiment of the invention. Programmable device 100 includes a number of logic array blocks (LABs), such as LABs 105, 110, 115. Each LAB includes a number of programmable logic cells using logic gates and/or look-up tables to perform a logic operation. LAB 105 illustrates in detail logic cells 120, 121, 122, 123, 124, 125, 126, and 127. Logic cells are omitted from other LABs in FIG. 1 for clarity. The LABs of device 100 are arranged into rows 130, 135, 140, and 145. In an embodiment, the arrangement of logic cells within a LAB and of LABs within rows provides a hierarchical system of configurable connections, in which connections between logic cells within a LAB, between cells in different LABs in the same row, and between cell in LABs in different rows require progressively more resources and operate less efficiently.

In addition to logic cells arranged in LABs, programmable device 100 also includes specialized functional blocks, such as multiply and accumulate block (MAC) 155 and random access memory block (RAM) 160. To implement hard-IP blocks, the programmable device includes one or more gate arrays 150. The gate arrays 150 can be programmed during manufacturing to implement a desired hard-IP block. Both the functional blocks and the gate arrays 150 are interfaced with the logic cells through the hierarchical system of configurable connections. For clarity, the portion of the programmable device 100 shown in FIG. 1 only includes a small number of logic cells, LABs, and functional blocks. Typical programmable devices will include thousands or tens of thousands of these elements.

Figure 2:
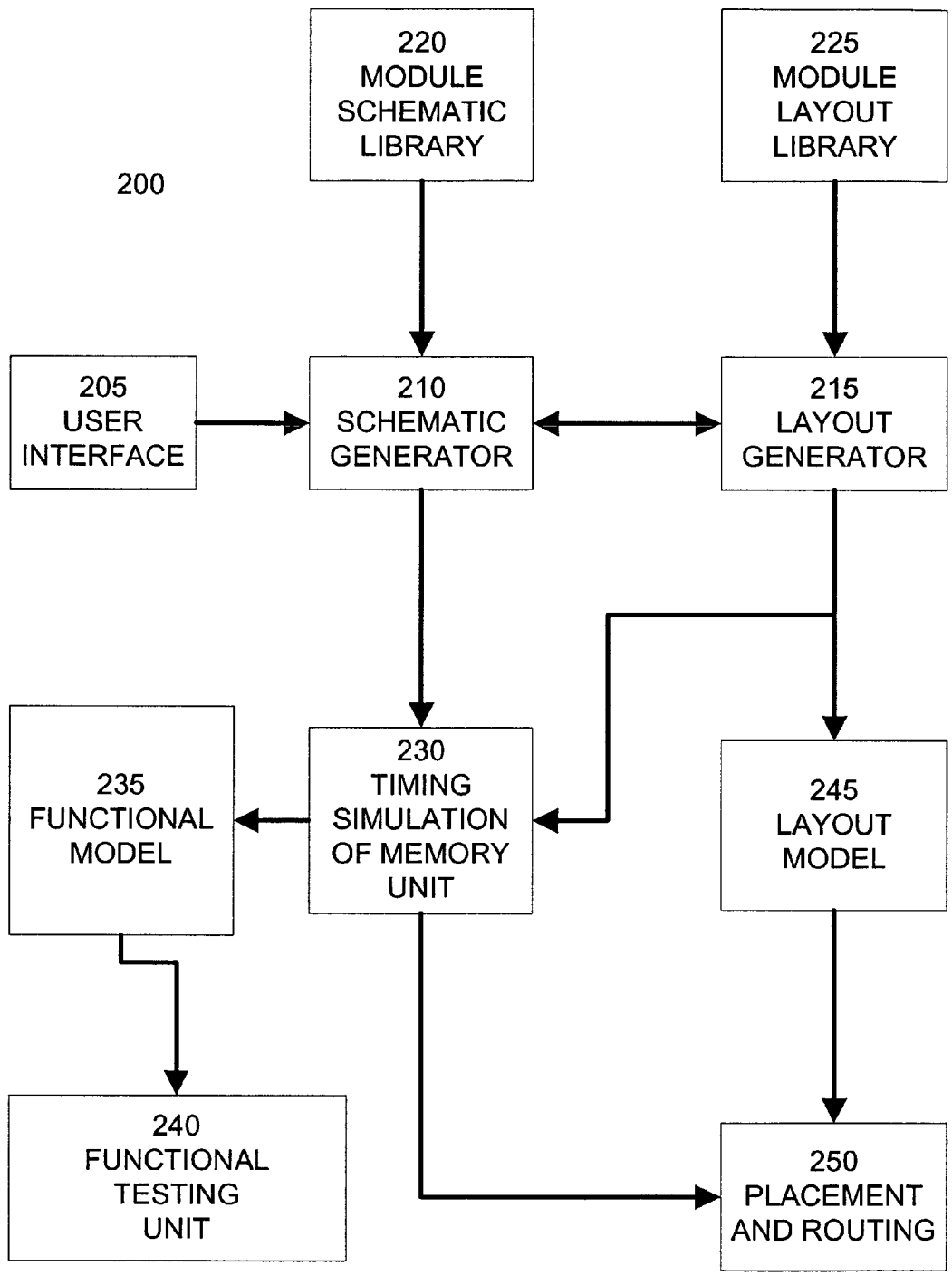
FIG. 2 illustrates a system for creating memory units for hard-EP blocks according to an embodiment of the invention.

FIG. 2 illustrates a system 200 for creating memory units for hard-IP blocks according to an embodiment of the invention. In an embodiment, a user provides a set of specifications for one or more memory units to be created for a hard-IP block using user interface 205. An embodiment of user interface 205 is a graphical user interface. In an embodiment, the set of memory specifications include the type of memory to be used by the memory unit, the number of read and write ports of the memory unit, the size of the memory unit, and the data width of the memory unit. If multiple memory units are required, the set of specifications includes the properties of each memory unit.

The type of memory can be any type of memory that can be implemented using a programmable gate array, including any type of DRAM, SRAM, or ROM memory. If the set of specifications includes ROM memory, a further embodiment of system 200 also allows users to specify a set of data to be programmed into the ROM memory. Examples of sets of data include look-up tables and program code.

The number of read and write ports specify how the memory unit can be accessed by its associated hard-IP block. For example, a memory unit with two read ports and one write port allows an hard-IP block to perform two read operations and one write operation simultaneously.

The size of the memory unit specify the total amount of information that can be stored in the memory unit. The data width specifies how information is organized in the memory unit. For example, a memory unit having a data width of eight bits will input and output data in eight bit increments, while a memory unit having a data width of thirty-two bits will use thirty-two bit increments.

The schematic generator 210 creates a schematic for a memory unit for the hard-IP block using the set of specifications received via the user interface 205. In an embodiment, the schematic generator 210 references a module schematic library 220 to create the schematic of the memory unit. The module schematic library 220 defines a set of modules that can be combined to create a memory unit satisfying any arbitrary set of specifications. Modules can be classified by their general function within the memory unit and an embodiment of the module schematic library 220 includes memory cell modules, register modules, address decoder modules, driver modules, sense amplifier modules, and self-testing modules. Additional module classes can be included in the module schematic library 220 to implement additional functions in the memory unit. In a further embodiment, each module is optimized to be implemented in a gate array architecture while minimizing area and maximizing performance. Modules can be designed using conventional full custom design methodologies based upon the transistors available in a base cell of the gate array.

The module schematic library 220 can include a number of different modules of a given type so as to cover all of the possible variations in memory units. For example, the module schematic library 220 can include memory cell modules implementing a single bit of SRAM, DRAM, and ROM. Similarly, instances of other types of modules, such as driver modules and sense amplifiers, can be tailored to work with specific types or quantities of memory cell modules.

The schematic generator 210 selects modules from the module schematic library 220. Modules are selected according to the set of specifications for the memory unit and for their compatibility with other selected modules. The schematic generator 210 then connects the selected modules together to create a schematic for the memory unit. Multiple copies of a selected module can be used in the schematic to meet the set of specifications for the memory unit.

The memory unit schematic created by the schematic generator 210 is input to the layout generator 215. Layout generator 215 creates a layout of the memory unit as implemented using at least a portion of the gate array. In an embodiment, the layout generator 215 references a module layout library 225 to create a layout of the memory unit within the gate array. The module layout library 225 defines a set of layout modules corresponding with the modules of the module schematic library 220. The layout modules can be combined to create a layout for the memory unit corresponding to the memory unit schematic.

To optimize memory units for optimal performance and efficient use of the gate array resources, the floorplan or high-level layout of the memory unit may need to vary depending upon the one or more of set of specifications for the memory unit, such as the size or type of memory unit. For example, an optimal small memory unit may locate its address decoders at one side of a set of memory cells, while an optimal large memory unit may locate the address decoders in the middle of the memory unit, surrounded on both sides by memory cells.

Figure 3A:
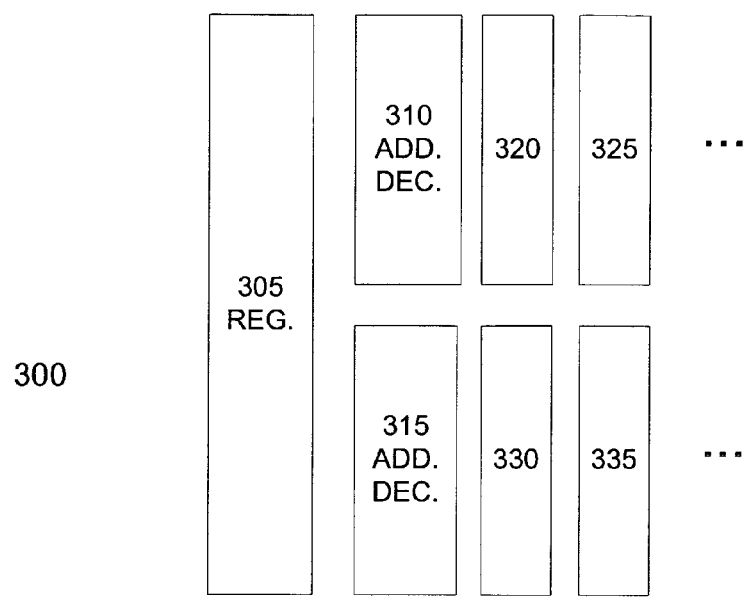
FIGS. 3A and 3B illustrate example memory unit floorplans according to an embodiment of the invention.
Figure 3B:
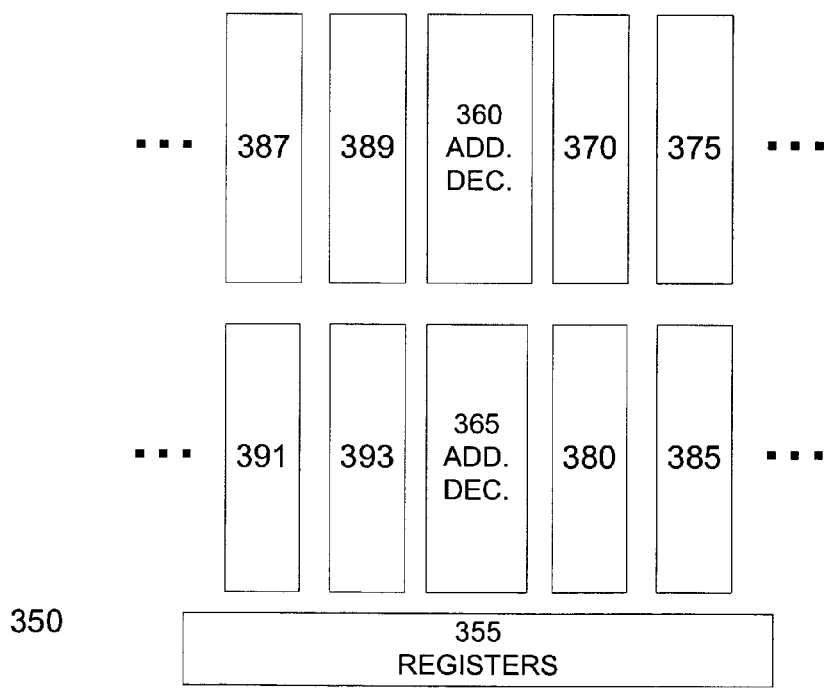

FIGS. 3A and 3B illustrate example memory unit floorplans according to an embodiment of the invention. FIG. 3A illustrates an example memory unit floorplan 300. Floorplan 300 specifies the location of layout modules for a memory unit. In this example, floorplan 300 specifies location 305 for layout modules implementing input and output registers 305; locations 310 and 315 for layout modules implementing address decoders; and locations 320, 325, 330, and 335 for layout modules implementing memory cells. In an embodiment, floorplan 300 specifies a variable number of locations for layout modules, such as for those implementing memory cells, so that memory units in a range of sizes can be accommodated by the floorplan 300. Other layout modules, such those for sense amplifiers, drivers, and self-testing, have been omitted from the example memory unit floorplan 300 for clarity.

FIG. 3B illustrates another example memory unit floorplan 350. In this example, floorplan 350 specifies location 355 for layout modules implementing input and output registers 355; locations 360 and 365 for layout modules implementing address decoders; and locations 370, 375, 380, 385, 387, 389, 391, and 393 for layout modules implementing memory cells. As with the previous example floorplan, an embodiment of floorplan 350 specifies a variable number of locations for layout modules, such as for those implementing memory cells, so that memory units in a range of sizes can be accommodated by the floorplan 350.

An embodiment of the module layout library 225 includes a set of memory unit floorplans optimized for performance and efficient use of the gate array resources. Each memory unit floorplan is optimized for a range of values of the set of specifications. For example, each memory unit floorplan can be optimized for a range of memory unit sizes. Additionally, some memory unit floorplans can be optimized for specific types of memory. Further, memory unit floorplans can be optimized for a range of read and write access ports.

An embodiment of the layout generator 215 uses the set of specifications to select the closest matching one of the set of memory unit floorplans from the module layout library 225. The layout generator also selects layout modules from the module layout library 225 corresponding to the modules used to construct the memory unit schematic. The layout generator 215 places the selected layout modules in the appropriate locations of the selected memory unit floorplan and connects the selected layout modules together to create a complete layout for the memory unit. Multiple copies of a selected layout module can be used in the memory unit floorplan to meet the set of specifications for the memory unit.

After a memory unit schematic and a memory unit layout have been created to match the set of specifications, the memory unit needs to be tested and integrated with the hard-IP block design. In an embodiment of system 200, the layout generator 215 uses the memory unit layout to determine RC signal delay parameters. The RC signal delay parameters are input to the timing simulation unit 230. Timing simulation unit 230 receives the memory unit schematic from schematic generator 210. Using the RC signal delay parameters and the memory unit schematic, timing simulation unit 230 conducts a timing simulation of the memory unit to determine the timing parameters of the memory unit.

The schematic generator 210 creates functional models 235 of the memory unit by itself and integrated with the design of the hard-IP block. The timing parameters determined by the timing simulation unit 230 are used to annotate the functional models 235. The functional models 235, including the timing parameters, are then evaluated by functional testing unit 240 to verify the correct operation of the memory unit alone and as integrated with the hard-IP block. In an embodiment, the functional models 235 can be expressed as Verilog models and evaluated by the functional testing unit 240 using conventional Verilog simulation techniques.

In addition to the functional evaluation, the memory unit and its associated hard-IP block can be processed with conventional placement and routing techniques to determine a programming configuration for the gate array of the target programmable device. In an embodiment, the layout generator 215 creates a layout model 245 of the memory unit. In an embodiment, the memory unit layout model 245 is expressed as a GDS layout. An embodiment of the layout model 245 also includes other information needed for placement and routing, such as the area and input and output pin locations.

The memory unit layout model 245 is integrated with a layout model for the hard-IP block, and the combined layout model is then processed by conventional placement and routing phases 250 to determine a configuration for the gate array of the target programmable device. This configuration can then be applied during the fabrication of the programmable device, for example using mask programming techniques, to implement the hard-IP block and its associated memory unit. In a further embodiment, a black-box timing model representation of the memory unit is created by the timing simulation unit 230 and used during the placement and routing phases 250 to generate an optimized configuration of the gate array.

Figure 4:
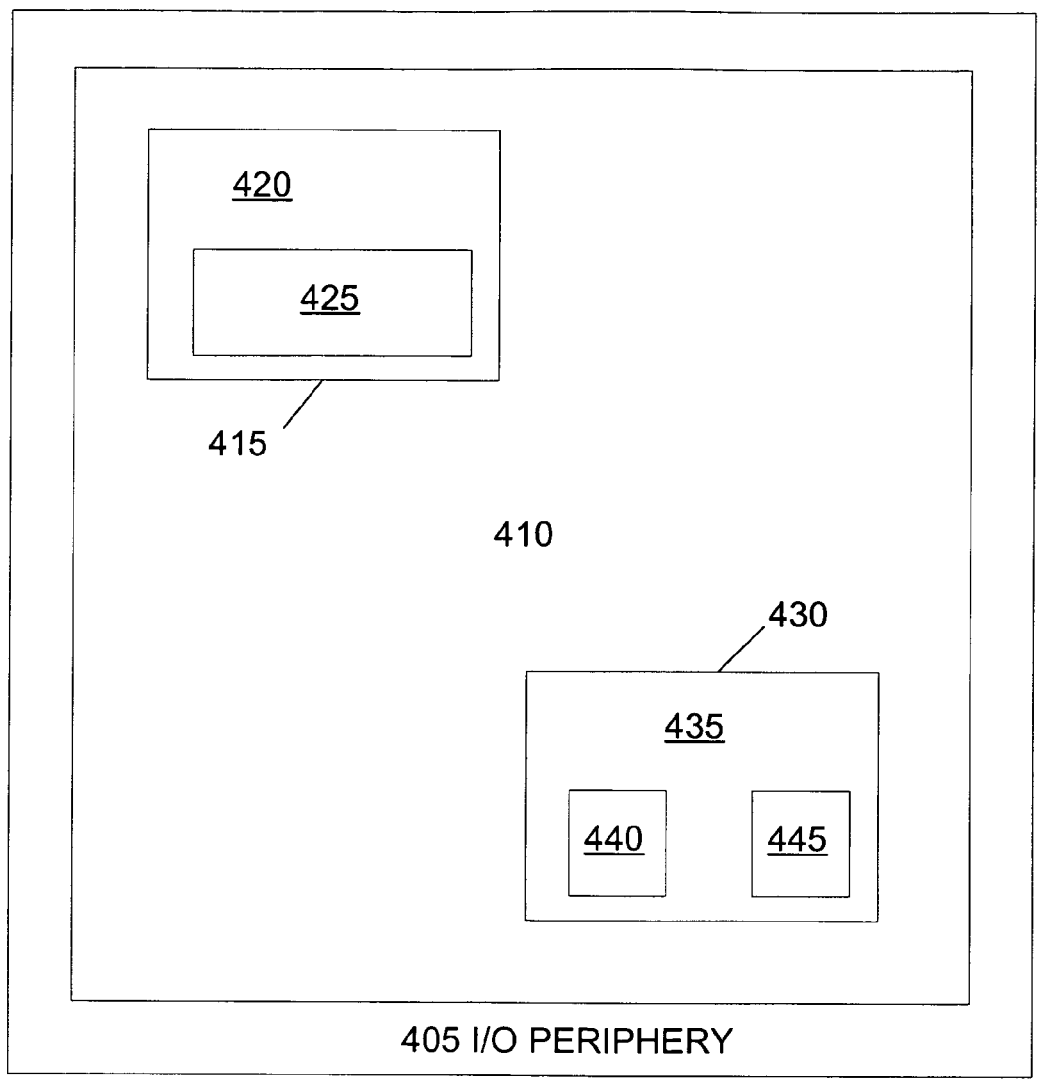
FIG. 4 illustrates an example programmable device having hard-IP blocks and memory units created using an embodiment of the invention.

FIG. 4 illustrates an example programmable device 400 having hard-IP blocks and memory units created using an embodiment of the invention. Programmable device 400 includes an I/O periphery 405 adapted to interface the programmable device with other devices. The FPGA core 410 includes logic cells, functional blocks, and a configurable switching circuit as described above for implementing user designs.

In addition to the FPGA core 410, this example programmable device 400 includes gate arrays 415 and 430 adapted to implement hard-IP blocks. In this example, gate array 415 includes a hard-IP block 420. Hard-IP block 420 includes a memory unit 425. The design of memory unit 425 was determined using system 200 to match a set of specifications required by hard-IP unit 420. Both hard-IP block 420 and its memory unit 425 are implemented within the gate array 415.

Similarly, gate array 430 includes hard-IP block 435. Hard-IP block 435 includes memory units 440 and 445. The design of both memory units 440 and 445 were determined using system 200 to match a set of specifications required by hard-IP unit 435. Memory units 440 and 445 may differ in size, type, the number of access ports, or any other combination of specifications. For example, memory unit 440 may be a ROM memory adapted to store program code or look-up tables for the hard-IP block, while memory unit 445 may be a RAM memory adapted to temporarily store data processed by the hard-IP block. Hard-IP block 435 and its memory units 440 and 445 are implemented within the gate array 430. The number of gate arrays in programmable device 400 and their configuration is shown for the purposes of illustration and programmable devices can have any number of gate arrays for implementing hard-IP blocks. Furthermore, the system 200 can create any arbitrary quantity and configuration of memory units for each hard-IP block.

Figure 5:
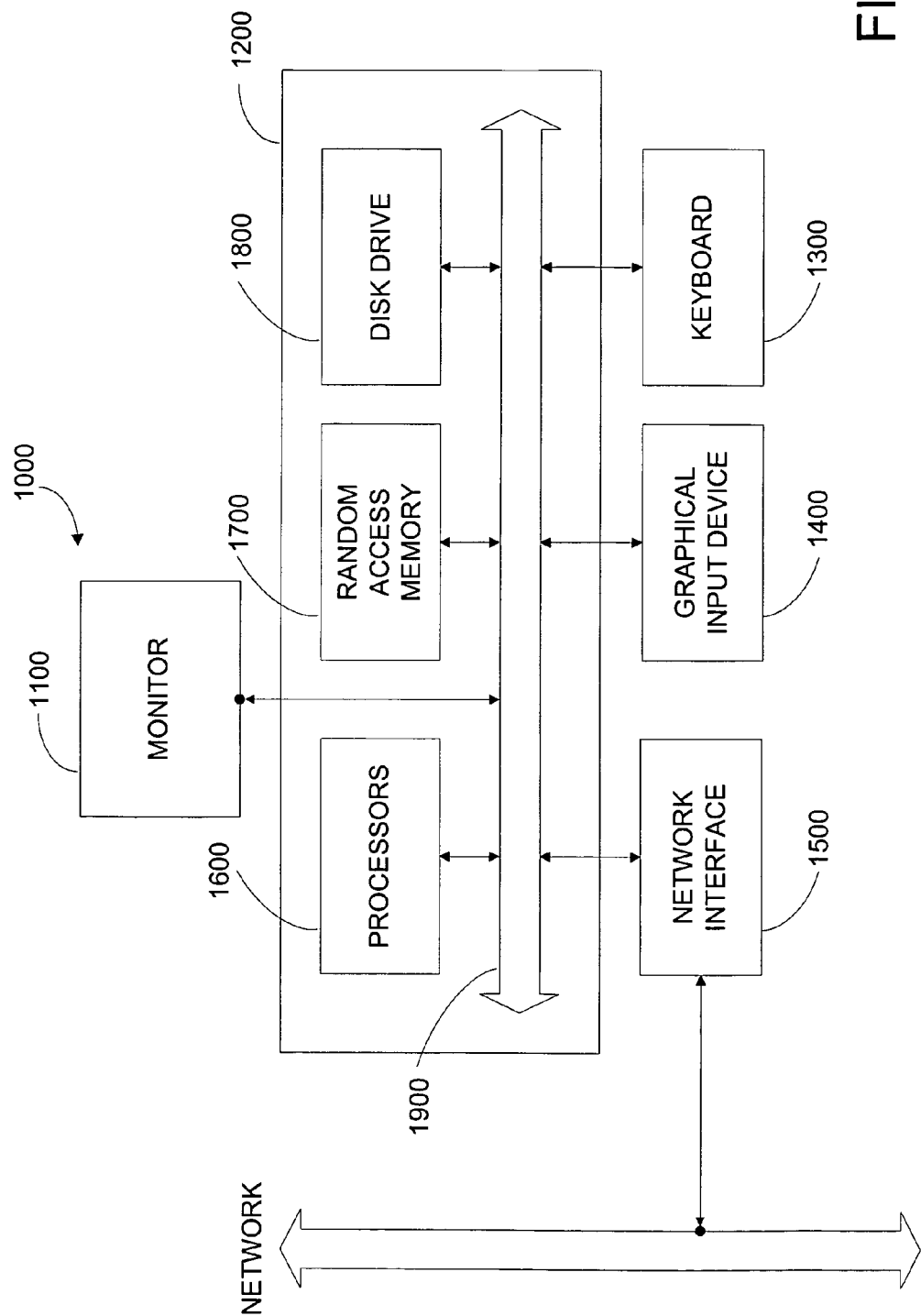
FIG. 5 illustrates an example computer system capable of implementing an embodiment of the invention.

FIG. 5 illustrates an example computer system 1000 capable of implementing an embodiment of the invention. Computer system 1000 typically includes a monitor 1100, computer 1200, a keyboard 1300, a user input device 1400, and a network interface 1500. User input device 1400 includes a computer mouse, a trackball, a track pad, graphics tablet, touch screen, and/or other wired or wireless input devices that allow a user to create or select graphics, objects, icons, and/or text appearing on the monitor 1100. Embodiments of network interface 1500 typically provides wired or wireless communication with an electronic communications network, such as a local area network, a wide area network, for example the Internet, and/or virtual networks, for example a virtual private network (VPN).

Computer 1200 typically includes components such as one or more general purpose processors 1600, and memory storage devices, such as a random access memory (RAM) 1700, disk drives 1800, and system bus 1900 interconnecting the above components. RAM 1700 and disk drive 1800 are examples of tangible media for storage of data, audio/video files, computer programs, applet interpreters or compilers, virtual machines, and embodiments of the herein described invention. Further embodiments of computer 1200 can include specialized input, output, and communications subsystems for configuring, operating, testing, and communicating with programmable devices. Other types of tangible media include floppy disks; removable hard disks; optical storage media such as DVD-ROM, CD-ROM, and bar codes; non-volatile memory devices such as flash memories; read-only-memories (ROMS); battery-backed volatile memories; and networked storage devices.

Further embodiments can be envisioned to one of ordinary skill in the art after reading the attached documents. For example, although the invention has been discussed with reference to programmable devices, it is equally applicable to other computer-aided design applications used to design any type of digital device, such as standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A system for determining a configuration of a memory unit, the system comprising:
   a user interface configured to receive memory unit specifications;
   schematic modules, wherein some of the schematic modules are configured to be combined to create a memory unit schematic satisfying arbitrary specifications;
   layout modules corresponding to the schematic modules and memory unit floorplans that specify locations in a memory unit layout for some of the layout modules;
   a schematic generator configured to select some of the schematic modules that match the memory unit specifications and to generate a memory unit schematic from the selected schematic modules; and
   a layout generator configured to select some of the layout modules that correspond with the selected schematic modules, to select a memory unit floorplan that matches the memory unit specifications, to generate a memory unit layout from the selected layout modules and the selected memory unit floorplan, and to output the memory unit layout; wherein the memory unit floorplan comprises a high-level layout for the memory unit, and wherein the memory unit floorplan includes placement regions for the selected layout modules.

2. The system of claim 1, wherein the schematic generator is further configured to output the memory unit schematic.

3. The system of claim 2, further comprising a timing simulation unit configured to determine signal delay parameters from the memory unit layout, to determine timing parameters for the memory unit schematic using a timing simulation including the signal delay parameters, and to annotate the memory unit schematic with the timing parameters.

4. The system of claim 2, further comprising a functional testing unit configured to verify that the memory unit schematic describes a correctly operating memory unit.

5. The system of claim 1, further comprising a placement and routing unit configured to determine from the memory unit layout a device configuration including an implementation of the memory unit.

6. The system of claim 5, wherein the device configuration further includes an implementation of a hard-IP block associated with the memory unit.

7. The system of claim 5, wherein the device configuration is configured to be implemented by a gate array to be programmed by a device manufacturer.

8. The system of claim 7, wherein the gate array is included in a programmable device configured to implement a user design.

9. The system of claim 1, wherein the schematic modules include schematics that each define a memory cell.

10. The system of claim 9, wherein the memory cell defined by at least one of the schematics is a RAM memory cell.

11. The system of claim 9, wherein the memory cell defined by at least one of the subset of schematic is a ROM memory cell.

12. The system of claim 11, wherein the memory unit specifications include ROM data to be stored in a memory unit.

13. The system of claim 1, wherein the schematic modules include schematic modules that each define an address decoder, a memory access register, a driver, a sense amplifier, or a self-test component.

14. The system of claim 1, wherein the memory unit specifications include a memory type.

15. The system of claim 1, wherein the memory unit specifications include a memory unit data width.

16. The system of claim 1, wherein the memory unit specifications include a memory unit size.

17. The system of claim 1, wherein each of the memory unit floorplans is associated with a range of memory unit sizes.

18. A method for designing a memory unit, the method comprising:
   receiving a memory unit specification;
   selecting a set of schematic modules matching the memory unit specification;
   generating a memory unit schematic from the set of schematic modules;
   selecting a set of layout modules corresponding with the set of schematic modules;
   selecting a memory unit floorplan matching the memory unit specifications, wherein the memory unit floorplan comprises a high-level layout for the memory unit, and wherein the memory unit floorplan includes placement regions for the set of layout modules;
   generating a memory unit layout from the set of layout modules and the memory unit floorplan; and
   outputting the memory unit layout.

19. The method of claim 18, further comprising:
   outputting the memory unit schematic;
   determining a signal delay parameter from the memory unit layout;
   performing a timing simulation including the signal delay parameter to determine a timing parameter for the memory unit schematic; and
   annotating the memory unit schematic with the timing parameters.

20. The method of claim 19, further comprising:
   performing a functional test including the memory unit schematic to verify that the memory unit schematic describes a correctly operating memory unit.

21. The method of claim 18, further comprising:
   determining a device configuration including an implementation of the memory unit using a placement and routing phase.

22. The method of claim 21, further comprising including in the device configuration a hard-IP block implementation associated with the memory unit.

23. The method of claim 21, further comprising implementing the device configuration by a gate array to be programmable by a device manufacturer.

24. The method of claim 23, further comprising including the gate array in a programmable device configured to implement a user design.

25. An information storage medium including a set of instructions adapted to operate an information processing device to perform a set of steps, the set of steps comprising:
   receiving a memory unit specification;
   selecting a set of schematic modules matching the memory unit specification;
   generating a memory unit schematic from the set of schematic modules;
   selecting a set of layout modules corresponding with the set of schematic modules;
   selecting a memory unit floorplan matching the memory unit specifications, wherein the memory unit floorplan comprises a high-level layout for the memory unit, and wherein the memory unit floorplan includes placement regions for the set of layout modules;
   generating a memory unit layout from the set of layout modules and the memory unit floorplan; and
   outputting the memory unit layout.

26. The information storage medium of claim 25, further comprising:
   outputting the memory unit schematic;
   determining a signal delay parameter from the memory unit layout;
   performing a timing simulation including the signal delay parameter to determine a timing parameter for the memory unit schematic; and
   annotating the memory unit schematic with the timing parameter.

27. The information storage medium of claim 26, further comprising:
   performing a functional test including the memory unit schematic to verify that the memory unit schematic describes a correctly operating memory unit.

28. The information storage medium of claim 25, further comprising:
   determining a device configuration including an implementation of the memory unit using a placement and routing phase.

29. The information storage medium of claim 28, further comprising including in the device configuration a hard-IP block implementation associated with the memory unit.

30. The information storage medium of claim 28, further comprising implementing the device configuration by a gate array to be programmable by a device manufacturer.

31. The information storage medium of claim 30, further comprising including the gate array in a programmable device adapted to implement a user design.

* * * * *